United States Patent
Kurby et al.

(10) Patent No.: US 6,252,455 B1
(45) Date of Patent: Jun. 26, 2001

(54) METHOD AND APPARATUS FOR EFFICIENT SIGNAL AMPLIFICATION

(75) Inventors: Christopher Neil Kurby, Elmhurst, IL (US); Joe Martin Smith, Scottsdale; Gary Parker English, Chandler, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/414,279

(22) Filed: Oct. 7, 1999

(51) Int. Cl.⁷ ..................................................... H03G 3/20
(52) U.S. Cl. ............................................. 330/136; 330/129
(58) Field of Search ............................... 330/10, 129, 136, 330/140, 141

(56) References Cited

U.S. PATENT DOCUMENTS

| | | | |
|---|---|---|---|
| 5,105,164 | * 4/1992 | Fisher et al. | 330/149 |
| 5,138,274 | * 8/1992 | Nakanishi et al. | 330/136 |
| 5,251,330 | 10/1993 | Chiba et al. | 455/91 |
| 5,420,536 | 5/1995 | Faulkner et al. | 330/149 |
| 5,732,334 | * 3/1998 | Miyake | 330/129 |
| 5,861,777 | 1/1999 | Sigmon et al. | 330/136 |
| 5,886,572 | 3/1999 | Myers et al. | 330/10 |
| 5,920,596 | 7/1999 | Pan et al. | 375/238 |
| 5,929,702 | 7/1999 | Myers et al. | 330/136 |
| 5,936,464 | * 8/1999 | Grondahl | 330/136 |
| 5,942,938 | 8/1999 | Myers et al. | 330/10 |
| 6,038,432 | * 3/2000 | Onoda | 330/129 |
| 6,057,732 | * 5/2000 | Morishita | 330/129 |

* cited by examiner

Primary Examiner—Robert Pascal
Assistant Examiner—Khanh Van Nguyen
(74) Attorney, Agent, or Firm—Timothy J. Lorenz; Randall S. Vaas (57) ABSTRACT

An amplifier circuit (100) includes a power amplifier (124) that has a modulated power supply input (125). The modulated power supply input (125) is modulated with a signal related to the amplitude of the signal being amplified by the power amplifier (124). The power amplifier (124) is maintained at a substantially constant operating point. The amplifier circuit (100) also includes a feedback path that generates an error signal as a function of the input signal envelope and the output signal envelope. The error signal is integrated and the resulting integrated error signal drives the gain control of a variable gain element (120) in the amplifier chain prior to the power amplifier (124).

23 Claims, 5 Drawing Sheets

METHOD AND APPARATUS FOR EFFICIENT SIGNAL AMPLIFICATION

FIELD OF THE INVENTION

The present invention relates generally to amplifiers and, in particular, to high power amplifiers that efficiently amplify signals with low distortion to the signal.

BACKGROUND OF THE INVENTION

Various apparatus exist for amplifying signals. In applications that involve high power amplification and transmission of modulated signals, a premium is placed on amplifier efficiency. In addition, because many modulated signals have information in the amplitude envelope as well as in the phase of the signal, a premium is placed on the ability to faithfully reproduce the amplitude and phase of the signal. In particular, the amplifier preferably exhibits very low distortion in both amplitude and phase.

Communications devices which transmit digitally modulated signals having information in both amplitude and phase are an example of applications where these qualities are in demand. In these applications, low distortion reduces undesired spectral components and ensures that occupied channel bandwidth is not degraded by the amplifier. Having a high efficiency amplifier design can reduce transmit current consumption, which allows the devices to operate longer on a single battery.

Some amplifiers are operated in their "linear" region. This is a region of operation that produces low distortion, but it is inefficient in terms of power consumption. One method of achieving increased efficiency is to allow the amplifiers to operate partially in "compression." When operating in compression, amplifiers are more efficient, but they are also outside the linear region of operation, and distortion results. Another method of achieving increased efficiency is to use saturating amplifiers. Saturating amplifiers, such as class D, class E, and class F amplifiers, operate beyond compression, in a region of "saturation," and they achieve the goal of high efficiency at the expense of non-linearity. Non-linear amplifiers, such as saturating amplifiers and amplifiers operating in compression, however, are generally not used in applications where information is included in the amplitude envelope, because that information is corrupted by the non-linear amplification.

In addition to distortion and loss of information, non-linear operation of amplifiers causes an increase in inter-modulation products. Intermodulation products cause undesirable amounts of energy to be present in frequency bands other than the one intended for use. This undesirable energy is commonly quantified and termed Adjacent Channel Power (ACP). Excessively high levels of ACP cause undesired interference to users operating in nearby channels. This degradation can cause an amplifier to be unsuitable for a particular application.

Since efficiency has traditionally been gained by driving amplifiers into compression and saturation, and since driving amplifiers into compression and saturation causes inter-modulation products to rise, high efficiency and low inter-modulation products have historically been traded off against each other. It would be very desirable to achieve low intermodulation products in a highly efficient amplifier, thereby obviating the need for a trade-off between the two.

Accordingly, there is a need for high efficiency amplifiers operating in compression and saturation exhibiting low distortion and low intermodulation products.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference numbers refer to similar items throughout the figures, and wherein:

DETAILED DESCRIPTION OF THE DRAWINGS

In the following detailed description, reference is made to the accompanying drawings that show, by way of illustration, specific embodiments in which the invention may be practiced. It is to be understood that other embodiments may be utilized and structural changes may be made without departing from the scope of the present invention.

The method and apparatus of the present invention provide an efficient mechanism for amplifying signals. An amplifier having a wideband control loop provides an efficient mechanism for creating a high fidelity amplified reproduction of the input. A power amplifier has an input signal with a time-varying amplitude, and it also has a power supply input tied to a power supply that provides a time-varying power supply signal. The time-varying power supply signal is derived from the amplitude of the input signal such that the power amplifier operates at a substantially constant compression point. A wideband feedback loop also operates to maintain linearity. The wideband feedback loop includes a gain compensator that acts to increase the bandwidth of the feedback loop as the magnitude of the input signal decreases.

Figure 1:
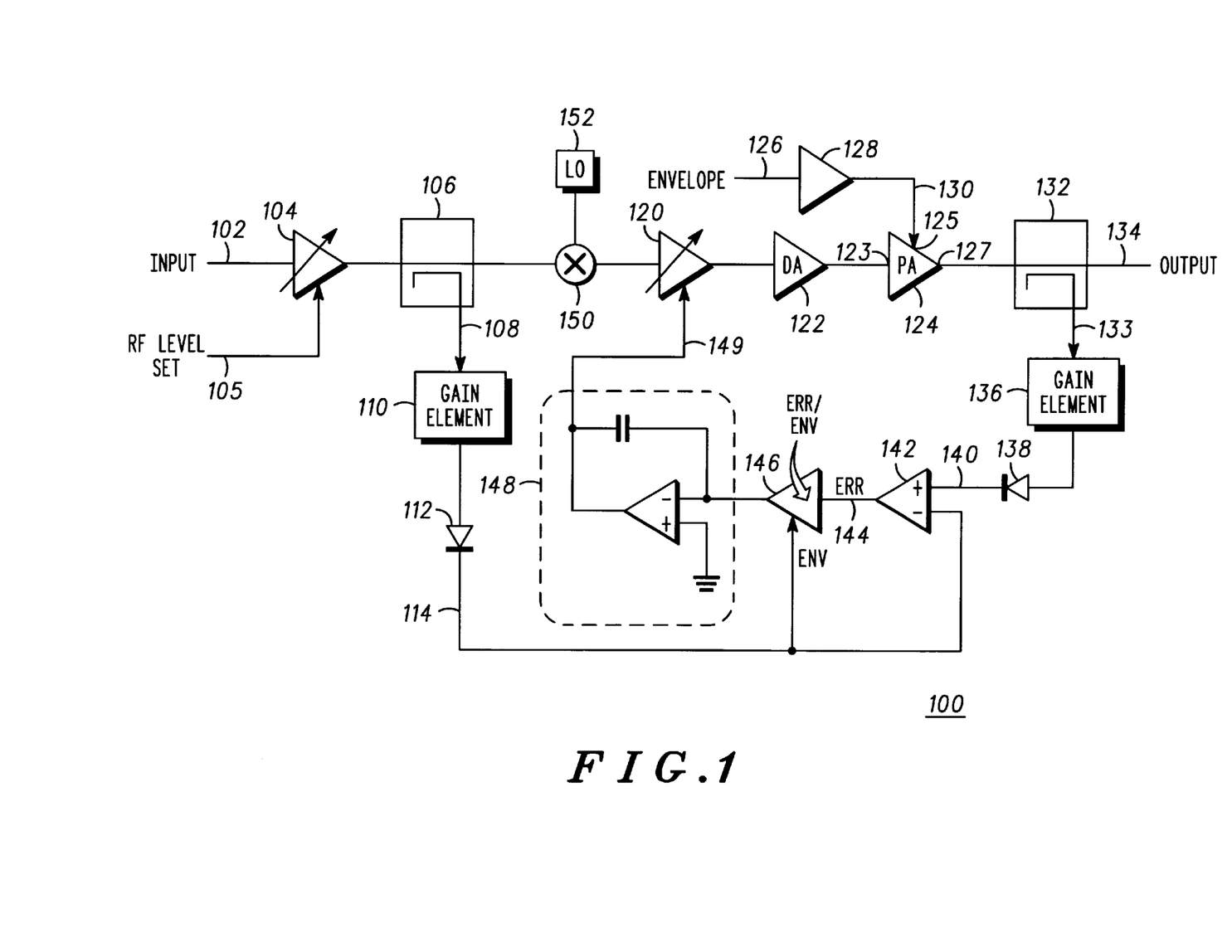
FIG. 1 shows an amplifier circuit in accordance with a preferred embodiment of the present invention.

Turning now to the drawings in which like reference characters indicate corresponding elements throughout the several views, attention is first directed to FIG. 1. FIG. 1 shows an amplifier circuit in accordance with a preferred embodiment of the present invention. Amplifier circuit 100 receives an input signal on input node 102 and produces an output signal on output node 134. The input signal impressed on input node 102 can be a signal modulated in phase and amplitude, and the output signal produced on output node 134 is an amplified reproduction of the input signal. The envelope signal impressed on node 126 is a signal representing the amplitude of the input signal on node 102.

The envelope signal can be derived from the input signal on node 102, or can be derived separately and provided to amplifier circuit 100 by a subsystem that also provides the input signal. For example, in some embodiments, a processor such as a digital signal processor generates the envelope signal and injects it on node 126. In other embodiments, a digital signal processor generates both the envelope signal and the input signal and provides them to amplifier circuit 100. When the envelope signal and the input signal are generated separately, differences in propagation delay may exist between the envelope (node 126 to 130) and signal paths (node 102 to 123). To compensate for this, the envelope signal and the input signal can be generated offset in time such that when they combine at power amplifier 125 they are aligned in time.

Amplifier circuit 100 includes variable gain amplifier 104 having input signal node 102. Variable gain amplifier 104 provides a variable gain function for amplifier circuit 100. The gain is varied by modifying a signal on radio frequency (RF) level set input 105. The output of variable gain amplifier 104 is input to coupler 106. Coupler 106 couples a portion of the input signal to node 108. The signal on node 108 is input to a feedback loop that is explained further below.

After passing through coupler 106, the input signal is input to frequency converter 150. Frequency converter 150 is driven by the input signal and by local oscillator (LO) 152. Frequency converter 150 converts the frequency of the input signal to its final RF frequency using circuitry well known in the art, such as a mixer. Frequency converter 150 allows an output signal on output node 134 to be at a different frequency than the input signal on input node 102. The output signal can be at a lower or higher frequency. For example, the input signal can be at an intermediate frequency (IF) that can be below or above the radio frequency (RF) of the output signal. In some embodiments, frequency converter 150 and LO 152 are not included within amplifier circuit 100. In these embodiments, the input signal and the output signal are at substantially the same frequency.

The output of frequency converter 150 is input to variable gain element 120. Variable gain element 120 can be a variable gain amplifier, a variable attenuator, or the like. Variable gain element 120 has a variable gain that is a function of a feedback signal on signal node 149. Variable gain element 128 drives driver amplifier 122. Driver amplifier 122 functions to increase the level of the signal input to power amplifier 124. Driver amplifiers used for this purpose are well known in the art.

Driver amplifier 122 drives power amplifier 124. Power amplifier 124 receives an input signal from driver amplifier 122 on input node 123. Power amplifier 124 also receives power on power supply input 125. Power supply input 125 is used as a modulating input. A signal on signal node 130 is input to power amplifier 124 at power supply input 125, thereby modulating power amplifier 124. In a preferred embodiment, power amplifier 124 includes multiple amplification stages, and the final stage of power amplifier 124 is receives power from power supply input 125. In this manner, power amplifier 124 can produce a modulated signal on output node 127.

Power amplifier 124 receives a signal on signal node 130. The signal is typically an amplified form of the envelope on signal node 126, but it may also be an intentionally distorted version of the envelope which compensates for non-linearities of the power amplifier 124. This distortion of the envelope may be provided by envelope amplifier 128, or by another circuit element, such as a digital signal processor that generates the envelope for amplifier 128. The envelope signal on input node 126 is amplified in envelope amplifier 128, and an amplified envelope signal on signal node 130 modulates power amplifier 124. Envelope amplifier 128 is preferably a high efficiency amplifier, such as a "class S" amplifier utilizing a pulsewidth modulator. An example of a suitable class S amplifier is shown and described in U.S. Pat. No. 5,886,572, issued Mar. 23, 1999, entitled "Method and Apparatus for Reducing Distortion in a Power Amplifier," the contents of which are incorporated herein by reference.

Class S amplifiers generally have loop bandwidths associated with feedback loops that exist within the class S amplifier. The loop bandwidth of the class S amplifier is a factor that determines how fast the output of the class S amplifier can respond. For example, if the envelope signal on node 126 includes high frequency components substantially above the loop bandwidth of envelope amplifier 128, the signal on node 130 may not accurately amplify the high frequency components of the envelope signal. The switching frequency of the class S amplifier can be increased to allow the class S amplifier loop bandwidth to be increased, but this typically results in lower class S amplifier efficiencies and therefore higher power consumption. The wideband feedback loop described below advantageously compensates for the loop bandwidth of envelope amplifier 128, thereby providing a high fidelity amplifier without having to increase the switching frequency (and the power consumption) of envelope amplifier 128. Another advantage of the wideband feedback loop is that it can compensate for non-linearities in elements 150,120,122 and 124.

Power amplifier 124 receives an input signal on input node 123 having a time-varying amplitude. Power amplifier 124 receives a modulated signal on power supply input 125 also having a time-varying amplitude. The amplitude of the input signal and the amplitude of the modulated signal are related such that power amplifier 124 operates at a substantially constant compression point. This is in contrast to amplifiers with fixed power supplies. For example, if power supply input 125 were held constant while a signal on input node 123 varied in amplitude, power amplifier 124 would operate in a linear region when the input signal had a low amplitude, and it would operate in compression when the input signal had a high amplitude. Power amplifiers are generally more efficient when operating in compression, but they also operate non-linearly when the amplifier moves in and out of compression. In the embodiment shown in FIG. 1, the power supply of power amplifier 124 tracks the amplitude of the input signal, thereby allowing power amplifier 124 to have a substantially constant operating point. In a preferred embodiment, power amplifier 124 is operated at about 1 dB into compression. Other values may also work, depending on the circuit configuration and components and as design optimization is carried out by those of ordinary skill. Operation of power amplifier 124 slightly in compression allows for increased efficiency, without causing excessive distortion.

The output signal on output node 127 of power amplifier 124 passes through coupler 132 to produce an amplified output signal on output node 134 and a coupled signal on node 133. The coupled signal on node 133 passes through gain element 136. Gain element 136 can be an amplifier, an attenuator, or the like. Likewise, referring now back to signal node 108 and gain element 110, gain element 110 can also be an amplifier, an attenuator, or the like. Gain element 136 drives envelope detector 138, producing a scaled output signal envelope on signal node 140. Gain element 110 drives envelope detector 112, producing a scaled input signal envelope on node 114. The scaled output signal envelope and the scaled input signal envelope are compared in difference amplifier 142, thereby producing an error signal on signal node 144. The remainder of the feedback loop works to reduce the error signal on node 144 to substantially zero.

The gains of gain element 110 and gain element 136 set the overall gain of amplifier circuit 100 after variable gain amplifier 104. For example, if the closed loop gain of the amplifier chain between coupler 106 and coupler 132 is desirably 20 dB, gain element 110 can have 20 dB more gain than gain element 136. In this case, the error signal on node 144 will be substantially zero when the gain of the amplifier chain between couplers 106 and 132 is 20 dB. One skilled in the art will appreciate that the functionality of coupler 106 and gain element 110 can be combined into a single coupler having a first coupling ratio, and that the functionality of coupler 132 and gain element 136 can be combined into a single coupler having a second coupling ratio. In this embodiment, the relative coupling ratios of coupler 106 and coupler 132 set the gain of amplifier circuit 100 after variable gain amplifier 104.

In some embodiments, envelope detectors 138 and 112 are circuit elements such as diodes that can cause distortion. In a preferred embodiment, any distortion caused by detectors 112 and 138 is substantially canceled when the difference of their outputs is taken. Detectors 112 and 138 can be driven at the same RF power input level, such that the distortion from each detector is substantially the same. When difference amplifier 142 subtracts one signal envelope from the other signal envelope, the distortion substantially cancels.

The error signal on node 144 is input to gain compensator 146. In the embodiment of FIG. 1, as the input signal on input node 102 drops to near zero, the loop bandwidth of the feedback loop also drops. In some embodiments, it is desirable to maintain a wide loop bandwidth to track high frequency error components that, if left untracked, can cause a non-linear response. Gain compensator 146 compensates for variations in loop gain by increasing loop gain as the scaled input envelope decreases, and by decreasing loop gain as the scaled input envelope increases. In a preferred embodiment, gain compensator 146 divides the amplitude of the error signal on node 144 by the amplitude of the scaled input envelope signal on node 114. As a result, as the input envelope increases in size, the compensated error signal output from gain compensator 146 decreases in size. Also, as lo the input envelope decreases in size, the compensated error signal increases in size.

Gain compensator 146 produces a compensated error signal and drives integrator 148. Integrator 148 integrates the compensated error signal, stabilizes the feedback loop, and produces a feedback signal on node 149. The feedback signal controls the gain of variable gain element 120, thereby closing the loop. Variable gain element 120 modifies its gain as a function of the feedback signal on node 149, driving the error signal on node 144 to substantially zero, and providing an output signal on output node 134 that is a faithful reproduction of the input signal on input node 102.

As previously stated, envelope amplifier 128 can be a class S amplifier with a loop bandwidth. The loop bandwidth of envelope amplifier 128 can be set such that envelope amplifier 128 is able to linearly amplify only a subset of frequency components of the envelope signal on node 126. A low loop bandwidth in envelope amplifier 128 can be advantageous in part because power savings can result. The wideband action of the feedback loop that includes gain compensator 146 can make up for the lower loop bandwidth of envelope amplifier 128 by modulating variable gain element 120. Variable gain element 120 modulates the input signal prior to being amplified by power amplifier 124, such that errors caused by the imperfect amplified envelope signal input to power supply input 125 are substantially compensated for by the modulated input signal at input node 123 of amplifier 124. The result is lower intermodulation products and lower adjacent channel power (ACP).

Amplifier circuit 100 is advantageous in part because the wideband feedback loop can compensate for a low loop bandwidth in envelope amplifier 128. As a result, in embodiments where envelope amplifier 128 is a class S amplifier, the switching frequency of the class S amplifier can be dropped, thereby saving power. Amplifier circuit 100 is also advantageous in part because non-linearities introduced by circuit components between coupler 106 and coupler 132 can be tracked out by the wideband feedback loop. Non-linearities tracked out by the wideband feedback loop can be caused by power amplifier gain variations, input drive level variations, amplitude modulation (AM) to AM distortion, and the like. A further advantage includes the operation of power amplifier 124 at a substantially constant operating point.

Figure 2:
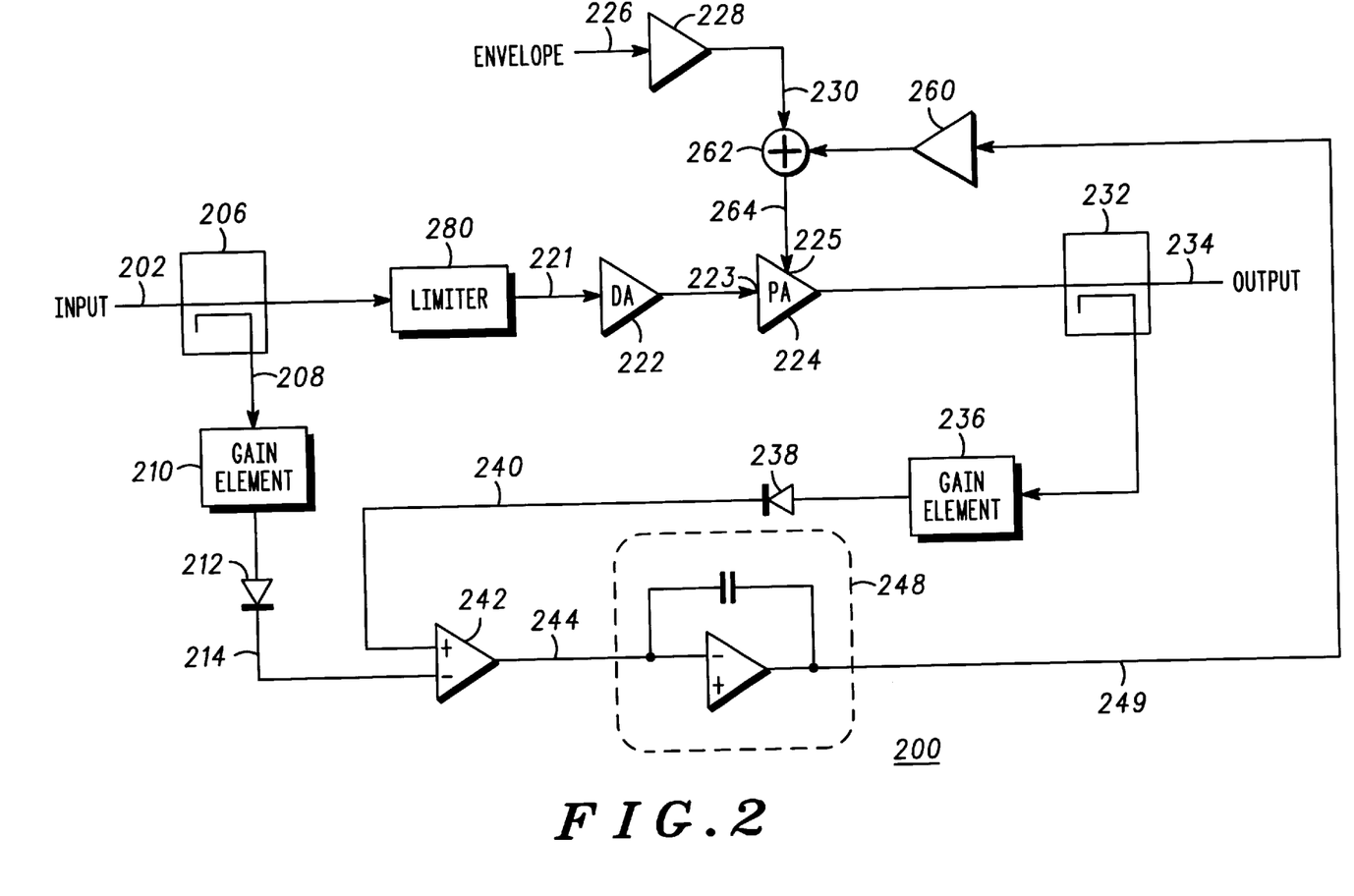
FIG. 2 shows an amplifier circuit in accordance with an alternate embodiment of the present invention.

FIG. 2 shows an amplifier circuit in accordance with an alternate embodiment of the present invention. Amplifier 200 utilizes a technique through which a highly efficient but non-linear radio frequency (RF) power amplifier can be combined with other, highly efficient amplifiers to produce a high efficiency linear amplifier system. The signal to be amplified is split into two paths: an amplitude path, and a phase path. The envelope is amplified efficiently in the amplitude path by a class S or other highly efficient power amplifier that operates on the bandwidth of the RF envelope rather than the RF bandwidth. The phase modulated carrier in the phase path is then amplitude modulated by the amplified envelope signal, creating an amplified replica of the input signal.

Amplifier circuit 200 includes couplers 206 and 232, gain elements 210 and 236, envelope detectors 212 and 238, difference amplifier 242, integrator 248, error amplifier 260, envelope amplifier 228, summing point 262, limiter 280, driver amplifier 222, and power amplifier 224. Amplifier circuit 200 receives an RF input into coupler 206. Coupler 206 splits the RF input signal into a feedback path which feeds gain element 210 and envelope detector 212, and a phase path which feeds limiter 280. Envelope detector 212 detects an envelope of the input signal, its output drives difference amplifier 242.

The phase path of amplifier circuit 200 includes limiter 280, driver amplifier 222, and power amplifier 224. Limiter 280 receives the input signal output from coupler 206, and it amplitude limits the signal. Limiter 280 can perform soft limiting, but limiter 280 preferably performs hard limiting so that the output of limiter 280 includes phase information with little or no amplitude information. After limiting, with the amplitude information removed, the resultant signal is the phase modulated carrier. The phase modulated carrier output from limiter 280 is then input to driver amplifier 222 which, in turn, drives power amplifier 224.

Power amplifier 224 is an amplifier stage capable of being modulated, and in one embodiment, it is a field effect transistor (FET) amplifier. Drains of FET amplifiers are conventionally connected to DC power sources; however, as will be discussed below, in a preferred embodiment exemplified herein, the drain of the FET amplifier is driven with a signal, resulting in an amplitude modulated output signal.

The amplitude path of amplifier circuit 200 includes envelope amplifier 228. Envelope amplifier 228 amplifies the envelope signal output from envelope detector 212 and drives power supply input 225 of power amplifier 224. Envelope amplifier 228 amplifies the envelope signal to a level commensurate with the desired output, and the resultant remodulation of the phase modulated carrier restores the envelope, producing an amplified replica of the input signal. The amplified envelope signal is typically an amplified form of the envelope on signal node 226, but it may also be an intentionally distorted version of the envelope which compensates for non-linearities of power amplifier 224. This distortion of the envelope may be provided by envelope amplifier 228, or by another circuit element, such as a digital signal processor that generates the envelope for amplifier 228. Power amplifier 224 is modulated in such a way as to maintain operation near saturation and therefore in a region of high efficiency. Because the highly efficient power amplifier 224 consumes the majority of the power consumed in amplifier circuit 200, the entire circuit is considerably more efficient than conventional amplifiers.

The envelope signal can be derived from the input signal on node 202, or it can be derived separately and provided to amplifier circuit 200 by a subsystem that also provides the input signal. For example, in some embodiments, a processor such as a digital signal processor generates the envelope signal and injects it on node 226. In other embodiments, a digital signal processor generates both the envelope signal and the input signal and provides them to amplifier circuit 200. When the envelope signal and the input signal are generated separately, differences in propagation delay may exist between the envelope path (node 226 to node 230) and signal paths (node 202 to node 223). To compensate for this, the envelope signal and the input signal can be generated offset in time such that when they combine at power amplifier 225 they are aligned in time.

Envelope amplifier 228 is preferably a pulsewidth modulated amplifier, capable of supplying power to power amplifier 224. Pulsewidth modulated amplifiers typically have a loop bandwidth associated therewith, and the ability of envelope amplifier 228 to accurately track the envelope is a function of the loop bandwidth of envelope amplifier 228. In some embodiments, envelope amplifier 228 has a loop bandwidth capable of tracking all but the highest frequencies in the envelope. The feedback loop including difference amplifier 242, integrator 248, and error amplifier 260 preferably provide a higher frequency response than envelope amplifier 228. The outputs of envelope amplifier 228 and error amplifier 260 are summed at summing point 262, and the resulting signal on node 264 drives power supply input 225 of power amplifier 224.

In one embodiment, envelope amplifier 228 provides a current output, as does error amplifier 260. The outputs of envelope amplifier 228 and error amplifier 260 are tied together such that summing point 262 is a common node where currents from the two amplifiers sum. In another embodiment, envelope amplifier 228 provides a voltage output, as does error amplifier 260. In this embodiment, summing point 262 is a voltage summing device.

The feedback loop of amplifier circuit 200 operates in a manner similar to that of amplifier circuit 100 (FIG. 1), except that the resultant feedback signal is used differently. Difference amplifier 242 receives scaled envelope signals on nodes 214 and 240 and produces an error signal on node 244. The error signal on node 244 is integrated by integrator 248, and the resultant integrated error signal is amplified in error amplifier 260. Error amplifier 260 closes the feedback loop by contributing power to power supply input 225 of power amplifier 224. The action of the feedback loop is to drive the error signal on node 244 to substantially zero.

In some embodiments, envelope detectors 238 and 212 are circuit elements such as diodes that can cause distortion. In a preferred embodiment, any distortion caused by detectors 212 and 238 is substantially canceled when the difference of their outputs is taken. Detectors 212 and 238 can be driven at the same RF power input level, such that the distortion from each detector is substantially the same. When difference amplifier 242 subtracts one signal envelope from the other signal envelope, the distortion substantially cancels.

Amplifier circuit 200 is advantageous in part because the wideband feedback loop can compensate for a low loop bandwidth in envelope amplifier 228. As a result, in embodiments where envelope amplifier 228 is a class S amplifier, the switching frequency of the class S amplifier can be dropped, thereby saving power. Amplifier circuit 200 is also advantageous in part because non-linearities introduced by circuit components between coupler 206 and coupler 232 can be tracked out by the wideband feedback loop. Non-linearities tracked out by the wideband feedback loop can be caused by power amplifier gain variations, input drive level variations, amplitude modulation (AM) to AM distortion, and the like.

Figure 3:
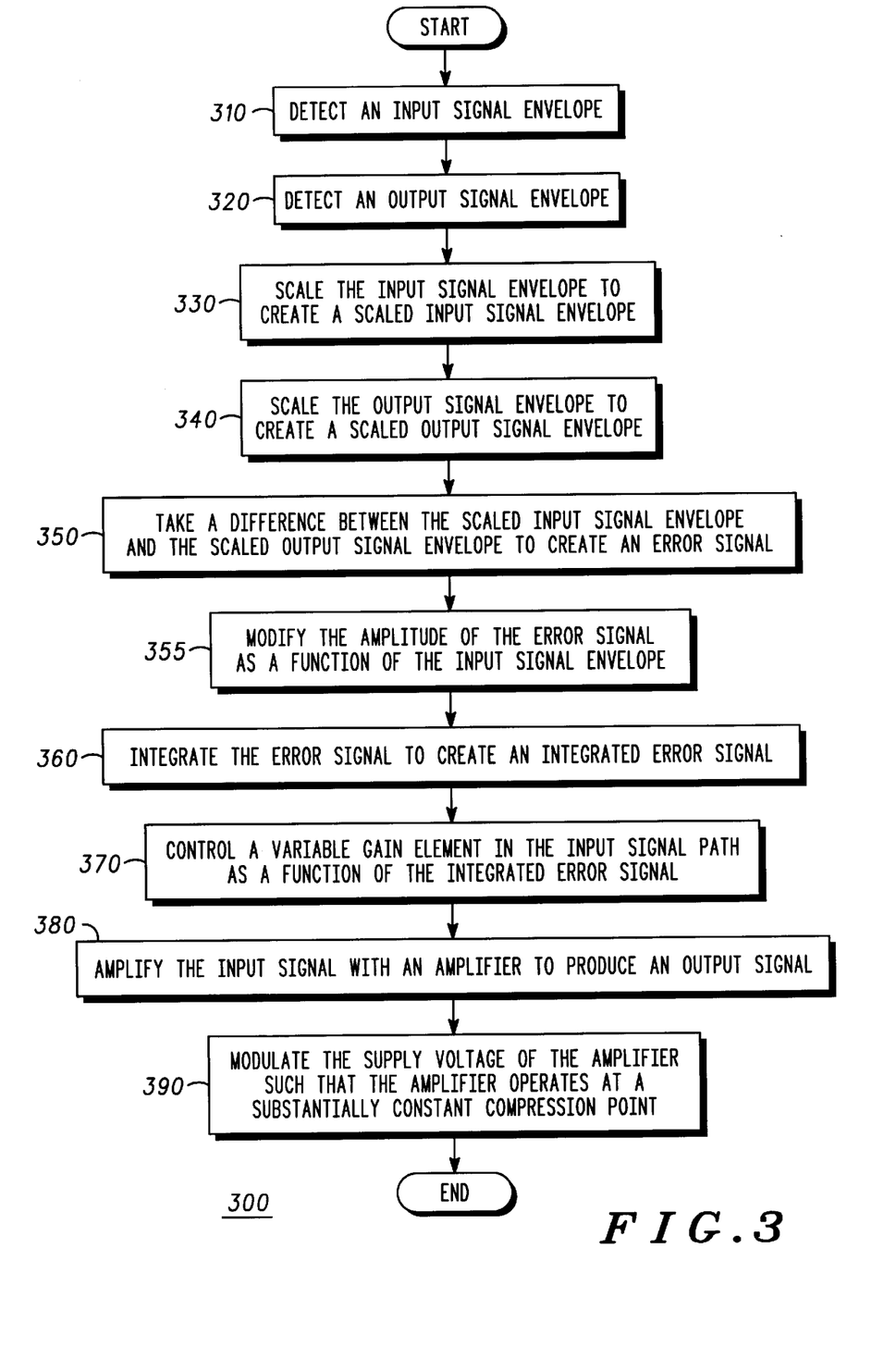
FIG. 3 is a flowchart of a method for amplifying a signal in accordance with a preferred embodiment of the present invention.

FIG. 3 is a flowchart of a method for amplifying a signal in accordance with a preferred embodiment of the present invention. Method 300 begins in step 310 when an input signal envelope is detected. In step 320, an output signal envelope is detected. Steps 310 and 320 can be performed by a combination of signal couplers, such as couplers 106 and 132, and amplitude detectors, such as detectors 112 and 138 (FIG. 1).

In step 330, the input signal envelope is scaled to create a scaled input signal envelope, and in step 340, the output signal envelope is scaled to create a scaled output signal envelope. Steps 330 and 340 can be performed by coupling ratios of couplers 106 and 132, and gain elements 110 and 136. In step 350, a difference is taken between the scaled input signal envelope and the scaled output signal envelope to create an error signal.

The amplitude of the error signal is modified as a function of the input signal envelope in step 355. The error signal is a signal in a feedback loop that has a loop bandwidth. A wide loop bandwidth can be advantageous in part because a wide loop bandwidth helps remove high frequency error components caused by non-linearities in the amplifier chain. As the input signal envelope and output signal envelope decrease in amplitude, the error signal resulting from step 350 also decreases in size, and the loop bandwidth decreases. In some embodiments of step 355, the loop bandwidth is increased as the input signal envelope decreases by dividing the amplitude of the error signal by the input signal envelope. In this manner, as the input signal envelope decreases, the error signal is amplified, thereby increasing the loop bandwidth. The result is a feedback loop having a wide bandwidth even when the input signal envelope is small.

The error signal is integrated in step 360. An integrated error signal is created by the integration of step 360. In step 370, a variable gain element in the input signal path is controlled as a function of the integrated error signal. The variable gain element of step 370 can be a variable gain element such as variable gain element 120 (FIG. 1). The variable gain element of step 370 can be an amplifier, an attenuator, or the like. In step 380, the input signal is amplified with an amplifier to produce an output signal, and in step 390, the supply voltage of the amplifier is modulated such that the amplifier operates at a substantially constant compression point. The amplifier of steps 380 and 390 can be a power amplifier such as power amplifier 124 (FIG. 1).

Method 300 is advantageous in part because a power amplifier is operated at a substantially constant compression point while providing a faithfully amplified reproduction of an input signal. The wide bandwidth feedback loop remains wideband even as the input signal envelope decreases. As a result, the amplification of method 300 is both efficient and high fidelity.

Figure 4:
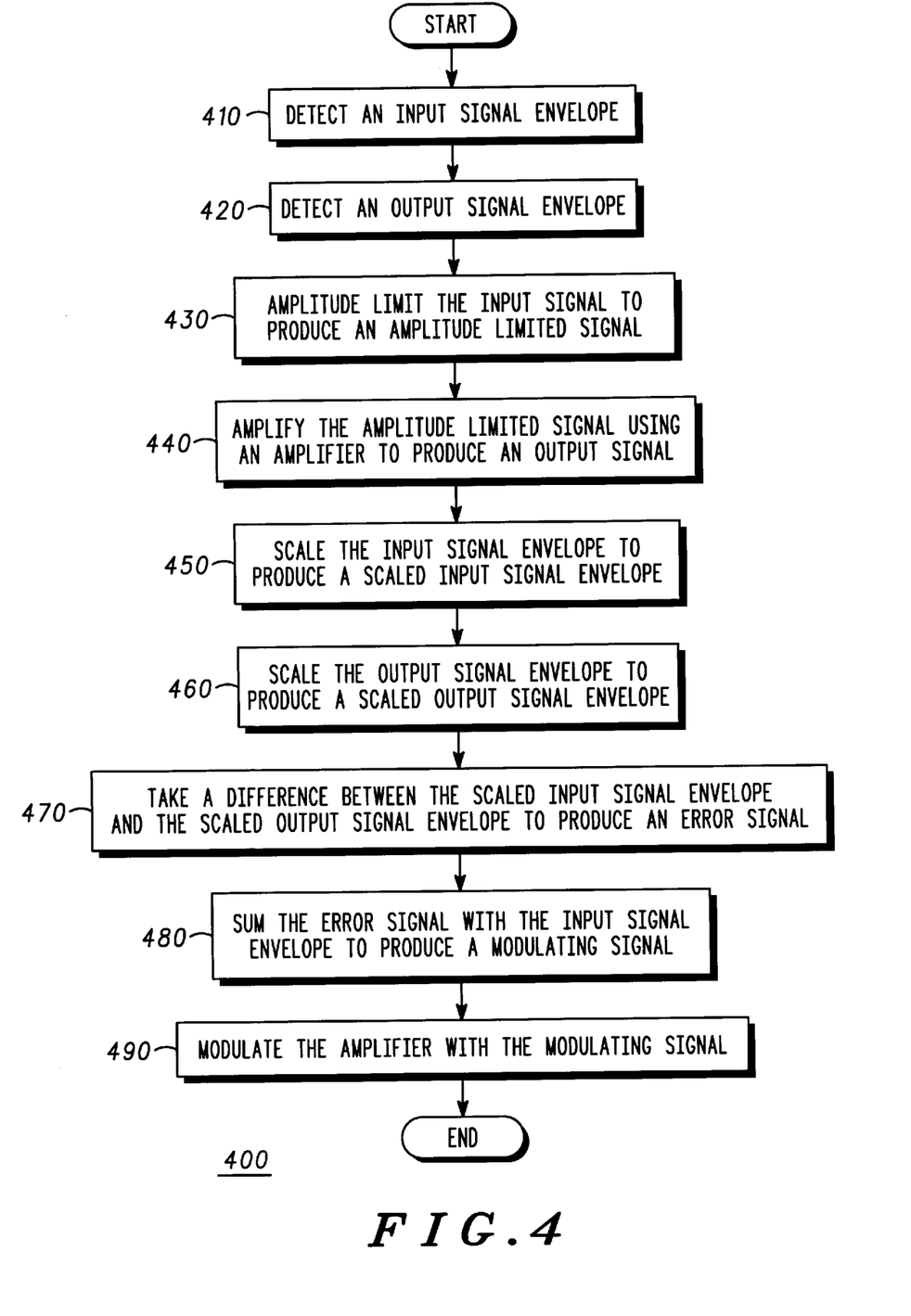
FIG. 4 is a flowchart of a method for amplifying a signal in accordance with an alternate embodiment of the present invention.

FIG. 4 is a flowchart of a method for amplifying a signal in accordance with an alternate embodiment of the present invention. Method 400 begins in step 410 when an input signal envelope is detected. In step 420, an output signal envelope is detected. Steps 410 and 420 can be performed by a combination of signal couplers and amplitude detectors such as signal couplers 206 and 232, and amplitude detectors 212 and 238 (FIG. 2). In step 430, the input signal is amplitude limited to produce an amplitude limited signal. In step 440, the amplitude limited signal is amplified using an amplifier, thereby producing an output signal. The amplitude limiting of step 430 can be performed by a limiter such as limiter 280 (FIG. 2), and the amplification of step 440 can be performed by a driver amplifier and power amplifier combination, such as those shown in FIG. 2.

In step 450, the input signal envelope is scaled to produce a scaled input signal envelope, and in step 460, the output signal envelope is scaled to produce a scaled output signal envelope. The scaling of envelopes performed in steps 450 and 460 can be performed by gain elements such as gain elements 210 and 236 (FIG. 2). In step 470, a difference is taken between the scaled input signal envelope and the scaled output signal envelope to produce an error signal. In step 480, the error signal is summed with the input signal envelope to produce a modulated signal, and in step 490, the amplifier is modulated with the modulated signal.

Figure 5:
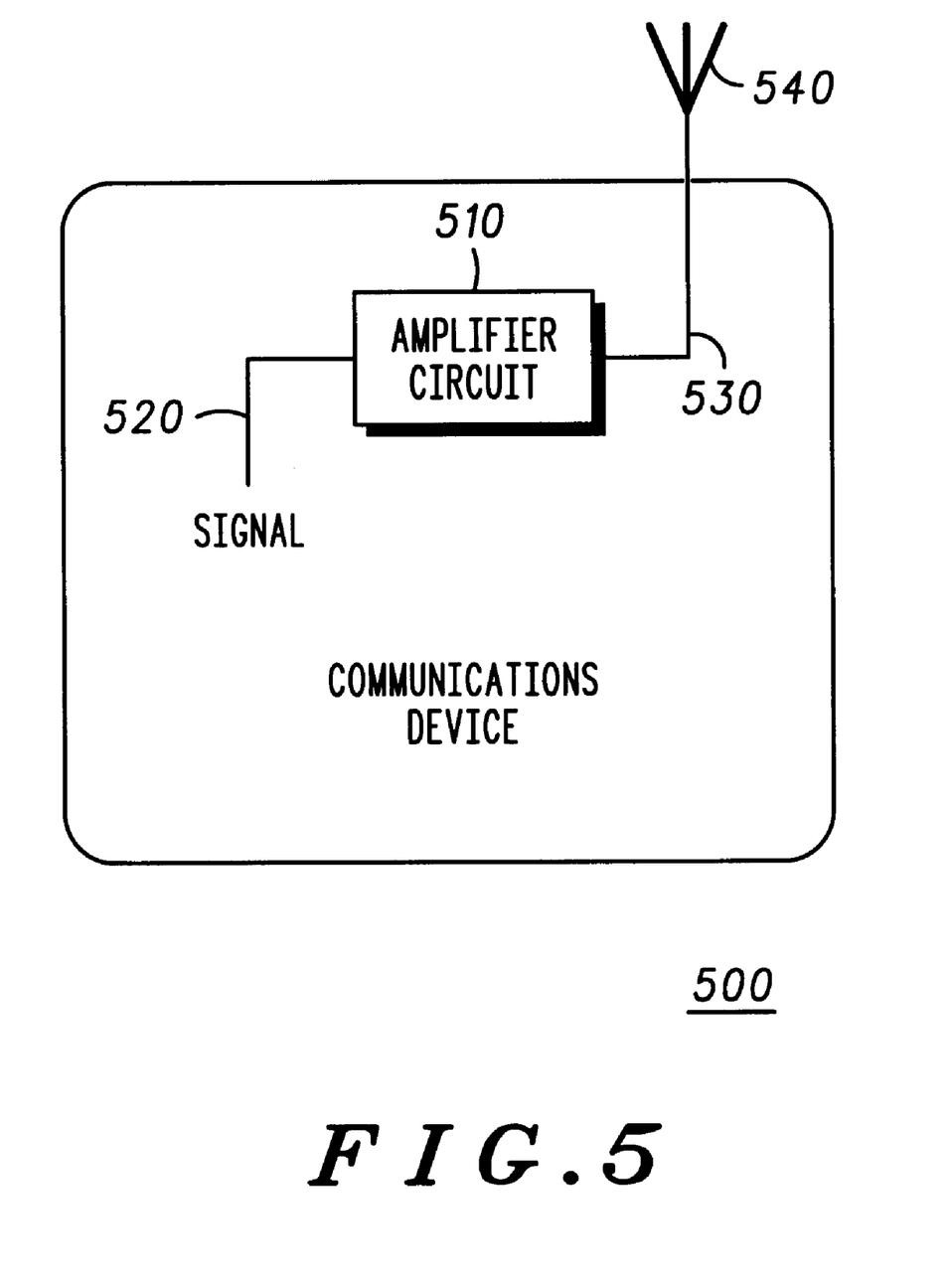
FIG. 5 shows a communications device in accordance with a preferred embodiment of the present invention.

FIG. 5 shows a communications device in accordance with a preferred embodiment of the present invention. Communications device 500 includes amplifier circuit 510 and antenna 540. Amplifier circuit 510 amplifies a signal on node 520, and it drives antenna 540. Amplifier circuit 510 may comprise any of the amplifier circuits of the present invention, including for example, amplifier circuit 100 (FIG. 1), or amplifier circuit 200 (FIG. 2). Communications device 500 may be one of many different devices capable of communications. Examples include, but are not limited to, subscriber units in a communications system, radio receivers, transmitters, and transceivers, one-way and two-way pagers, and cellular phones.

In summary, the method and apparatus of the present invention provides an efficient amplifier suitable for amplifying signals. While we have shown and described specific embodiments of the present invention, further modifications and improvements will occur to those skilled in the art. For example, while the method and apparatus of the present invention have been described with reference to an amplifier used in a communications device, the method and apparatus of the present invention also apply to any application for an amplifier, such as uses for amplifiers not in communications systems. We desire it to be understood, therefore, that this invention is not limited to the particular forms shown and we intend in the appended claims to cover all modifications that do not depart from the spirit and scope of this invention.

What is claimed is:

1. A method of amplifying an input signal, the method comprising:
   detecting an input signal envelope;
   detecting an output signal envelope;
   generating an error signal as a function of the input signal envelope and the output signal envelope;
   modifying an amplitude of the error signal as a function of the input signal envelope;
   adjusting an amplitude of the input signal as a function of the error signal;
   amplifying the input signal with an amplifier to produce an output signal; and
   modulating the amplifier as a function of the input signal envelope.

2. The method of claim 1 wherein generating an error signal includes:
   scaling the input signal envelope to create a scaled input signal envelope;
   scaling the output signal envelope to create a scaled output signal envelope; and
   taking a difference between the scaled input signal envelope and the scaled output signal envelope to create the error signal.

3. The method of claim 2 wherein adjusting the amplitude of the input signal comprises controlling a variable gain element as a function of the error signal.

4. The method of claim 3 wherein modifying the amplitude of the error signal comprises dividing the error signal by the input signal envelope.

5. The method of claim 3 wherein controlling a variable gain element comprises:
   integrating the error signal to create an integrated error signal; and
   controlling the variable gain element as a function of the integrated error signal.

6. The method of claim 5 wherein the variable gain element is a variable gain amplifier having a control input, and controlling the variable gain element includes driving the control input with an integrator output.

7. The method of claim 1 wherein modulating the amplifier includes:
   amplifying the input signal envelope to create an amplified envelope; and
   modulating a supply voltage of the amplifier such that the amplifier operates at a substantially constant compression point.

8. The method of claim 7 wherein amplifying the input signal envelope comprises amplifying the input signal envelope with a pulsewidth modulating amplifier.

9. A method of amplifying an input signal, the method comprising:
   detecting an input signal envelope;
   detecting an output signal envelope;
   amplitude limiting the input signal to produce an amplitude limited signal;
   amplifying the amplitude limited signal using an amplifier to produce an output signal;
   modulating the amplifier with the input signal envelope;
   further modulating the amplifier as a function of the output signal envelope;
   wherein modulating the amplifier comprises amplifying the input signal envelope to produce an amplified envelope signal by modulating a power supply input of the amplifier with the amplified envelope and modulating a power supply input of the amplifier with the amplified envelope signal; and
   wherein further modulating comprises scaling the input signal envelope to produce a scaled input signal envelope;
   scaling the output signal envelope to produce a scaled output signal envelope;
   taking a difference between the scaled input signal envelope and the scaled output signal envelope to produce an error signal;

summing the error signal with the amplified envelope signal to produce a modulating signal; and modulating the amplifier with the modulating signal.

10. The method of claim 9 further comprising:

prior to summing the error signal with the amplified envelope signal, integrating the error signal.

11. The method of claim 9 further comprising:

prior to summing the error signal with the amplified envelope signal, amplifying the error signal.

12. The method of claim 9 wherein summing the error signal with the amplified envelope signal comprises summing a current of the error signal with a current of the amplified envelope signal, such that the modulating signal has a modulated current.

13. An amplifier circuit comprising:

a power amplifier having an input node, an output node, and a modulating input node, the power amplifier configured to produce an output signal on the output node;

a variable gain device having an input node configured to receive an input signal having an input signal envelope, an output node coupled to the input node of the power amplifier, and a control input node responsive to a feedback signal;

a feedback loop configured to produce the feedback signal responsive to the input signal and the output signal, wherein the feedback loop includes a gain compensator configured to increase a loop gain of the feedback loop as the input signal envelope decreases in amplitude; and an envelope amplifier responsive to the input signal envelope, the envelope amplifier configured to drive the modulating input node of the power is amplifier.

14. The amplifier circuit of claim 13 wherein the feedback loop includes:

a first envelope detector coupled to an input node of the amplifier circuit, the first envelope detector configured to produce the input signal envelope;

a second envelope detector coupled to an output node of the amplifier circuit, the second envelope detector configured to produce an output signal envelope; and a differencing circuit configured to take the difference between the input signal envelope and the output signal envelope, and produce an error signal, the feedback signal being a function of the error signal.

15. The amplifier circuit of claim 14 wherein the gain compensator is configured to divide the error signal by the input signal envelope.

16. The amplifier circuit of claim 14 further comprising an integrator coupled between the differencing circuit and the variable gain device, the integrator being configured to integrate the error signal and produce the feedback signal.

17. The amplifier circuit of claim 13 wherein the envelope amplifier is a pulsewidth modulating amplifier.

18. An amplifier circuit comprising:

a power amplifier configured to produce an output signal having an output signal envelope, the power amplifier having a modulating input responsive to an input signal envelope, and having a signal input responsive to a modulated input signal;

a variable gain element configured to produce the modulated input signal responsive to an input signal and a feedback signal;

a feedback loop configured to produce the feedback signal responsive to the input signal envelope and output signal envelope, wherein a loop gain is modified as a function of the input signal envelope;

wherein the feedback loop comprises a first envelope detector configured to detect the input signal envelope, a second envelope detector configured to produce the output signal envelope; and a differencing circuit configured to take the difference between the input signal envelope and the output signal envelope, and produce an error signal, the feedback signal being a function of the error signal.

19. The amplifier circuit of claim 18 wherein the feedback loop further includes a gain compensator configured to increase a loop gain of the feedback loop as the input signal envelope decreases in amplitude.

20. The amplifier circuit of claim 19 wherein the gain compensator is configured to divide the error signal by the input signal envelope.

21. The amplifier circuit of claim 18 further comprising an integrator coupled between the differencing circuit and the variable gain element, the integrator being configured to integrate the error signal and produce the feedback signal.

22. An amplifier circuit comprising:

a power amplifier configured to produce an output signal having an output signal envelope, the power amplifier having a modulating input responsive to an input signal envelope, and having a signal input responsive to a modulated input signal;

a variable gain element configured to produce the modulated input signal responsive to an input signal and a feedback signal;

a feedback loop configured to produce the feedback signal responsive to the input signal envelope and output signal envelope, wherein a loop gain is modified as a function of the input signal envelope; and a pulse width modulating amplifier having an output coupled to the modulating input of the power amplifier.

23. An amplifier circuit comprising:

a power amplifier configured to produce an output signal having an output signal envelope, the power amplifier having a modulating input responsive to an input signal envelope, and to a feedback signal;

a feedback loop configured to produce the feedback signal responsive to the input signal envelope and output signal envelope;

a first envelope detector configured to detect the input signal envelope;

a second envelope detector configured to produce the output signal envelope;

a differencing circuit configured to take the difference between the input signal envelope and the output signal envelope, and produce an error signal, the feedback signal being a function of the error signal;

an envelope amplifier responsive to the input signal envelope, the envelope amplifier configured to produce a first current at the modulating input of the power amplifier; and an error signal amplifier responsive to the error signal, the error signal amplifier configured to produce a second current at the modulating input of the power amplifier, such that the sum of the first current and the second current modulate the power amplifier.

* * * * *